US006922353B2

(12) United States Patent
Radominski et al.

(10) Patent No.: US 6,922,353 B2
(45) Date of Patent: Jul. 26, 2005

(54) MEMORY FOR STORING INFORMATION

(75) Inventors: George Radominski, Corvallis, OR (US); Timothy L Weber, Corvallis, OR (US); Steven D Leith, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 74 days.

(21) Appl. No.: 10/208,367

(22) Filed: Jul. 29, 2002

(65) Prior Publication Data

US 2004/0017694 A1 Jan. 29, 2004

(51) Int. Cl.$^7$ .............................................. G11C 11/00
(52) U.S. Cl. ........................................ 365/153; 369/127
(58) Field of Search ..................... 346/150.3; 204/242; 324/94; 361/434; 365/151, 153; 369/99, 127

(56) References Cited

U.S. PATENT DOCUMENTS

| | | | | |
|---|---|---|---|---|
| 3,172,083 A | * | 3/1965 | Constantine, Jr. ............ 365/153 |
| 3,222,654 A | * | 12/1965 | Widrow et al. ............. 365/153 |
| 3,680,063 A | * | 7/1972 | Pinto .......................... 365/153 |
| 4,954,704 A | * | 9/1990 | Elings et al. ............... 250/307 |
| 5,202,879 A | * | 4/1993 | Oguchi et al. .............. 369/126 |
| 5,257,024 A | * | 10/1993 | West ........................... 341/16 |
| 5,557,596 A | | 9/1996 | Gibson et al. |
| 5,623,295 A | * | 4/1997 | Kishi et al. ................. 347/111 |
| 5,761,115 A | | 6/1998 | Kozicki et al. ............. 365/182 |
| 5,894,058 A | * | 4/1999 | Hatakeyama et al. ....... 430/313 |
| 5,896,312 A | | 4/1999 | Kozicki et al. ............. 365/153 |
| 5,914,893 A | | 6/1999 | Kozicki et al. ............. 365/107 |
| 6,084,796 A | | 7/2000 | Kozicki et al. ............. 365/153 |
| 6,208,553 B1 | | 3/2001 | Gryko et al. ............... 365/151 |
| 6,212,093 B1 | | 4/2001 | Lindsey ...................... 365/151 |
| 6,272,038 B1 | | 8/2001 | Clausen et al. ............. 365/151 |
| 6,324,091 B1 | | 11/2001 | Gryko et al. ............... 365/151 |
| 6,348,365 B1 | | 2/2002 | Moore et al. ............... 438/130 |
| 6,352,854 B1 | | 3/2002 | Nova et al. ............. 435/287.1 |
| 6,381,169 B1 | | 4/2002 | Bocian et al. ............. 365/151 |
| 2001/0026468 A1 | | 10/2001 | Tanikawa |

FOREIGN PATENT DOCUMENTS

| | | |
|---|---|---|
| EP | 0325056 | 7/1989 |
| EP | 0871165 | 10/1998 |
| JP | 2-146128 | 6/1990 |
| JP | 4-76840 | 3/1992 |
| JP | 6-28841 | 2/1994 |

OTHER PUBLICATIONS

Gaudet, Lorenz & Phillips. "Electrochemical Memory"; IBM Technical Disclosure Bulletin; vol. 9 No. 3 Aug. 1966.
IBM Corp. "Flash Memory Based on Electrolytic Plating"; Research Disclosure, Kenneth Mason Publications; vol. 448 No. 173 Aug. 2001.

(Continued)

*Primary Examiner*—Lamson Nguyen
*Assistant Examiner*—Blaise Mouttet (57) ABSTRACT

A memory apparatus has a plurality of first electrodes and at least one second electrode separated by an electrolyte solution. Information may be recorded by causing an electrical current to flow between a selected of the first electrodes and the second electrode to deposit an electrochemically active material on one of the selected first or the second electrodes. A method for recording and reading information has steps of writing the information by causing a current to flow between a first and a second electrode through an electrolyte solution to cause an electrochemically active material to electrodeposit, and reading the information by sensing the deposited material with a sensor.

28 Claims, 4 Drawing Sheets

OTHER PUBLICATIONS

B. Swaroop, W.C. West, G. Martinez, M.N. Kozicki, and L.A. Akers, *Programmable current mode hebbian learning neural network using programmable metallization cell, IEEE*, 1998.

M2 Presswire, *Micron technology licenses axon's programmable metallization cell technology, IAC (SM) Newsletter Database (TM)*, M2 Communications Ltd, Jan. 21, 2002.

Electronic Materials Update [EMU], *Micron licenses axons PMC, Elemental Semiconductors*; vol. 16, No. 2, Business Communications Co., Feb. 2002.

Ron Neal, *Micron to look again at non–volatile amorphous memory, Electronic Engineering Design*, CMP Information Ltd, Apr. 22, 2002.

Author unknown, *Introduction to PMCm*, www.axontc.com.

* cited by examiner

MEMORY FOR STORING INFORMATION

FIELD OF THE INVENTION

The invention is in the microelectronics and memory fields. The invention particularly concerns programmable memories for storing data, as well as methods for storing data.

BACKGROUND OF THE INVENTION

Memories such as programmable memories are used in the electronic and computer arts to store information in the form of binary data consisting of bits. Examples of memories include magnetic and optical media organized into discrete sections. Data is stored in these memory media by inducing a discernable change in a selected section, with the changed or unchanged state of the section indicative of a binary bit.

As the computer and electronic arts have advanced and have evolved into the microelectronics field, demands on memory apparatuses have steadily increased. For example, the amount of data desired to be stored on devices has substantially increased. Also, it is desirable for memories to be small and lightweight for use in portable device applications. As a result, it is desirable to increase the storage density of memory apparatuses.

SUMMARY OF THE INVENTION

An embodiment of a method of the invention is directed to causing an electrical current to flow through an electrolyte solution separating a first electrode from a second electrode to cause an electrochemical modification of the second electrode to thereby store the information, and then reading the information by detecting the electrochemical modification with a sensor.

DETAILED DESCRIPTION OF THE INVENTION

The present invention concerns a memory apparatus for storing information, and more preferably also for reading and erasing the stored information. Memory apparatus embodiments of the invention write, read, and erase information through electrochemical mechanisms. Information may be written by causing an electrical current to flow through an electrolyte solution between two electrodes to thereby electrochemically modify one of the electrodes. The information may be read by detecting the electrochemical modification with a sensor, and may be erased by reversing the electrochemical modification.

Figure 1:
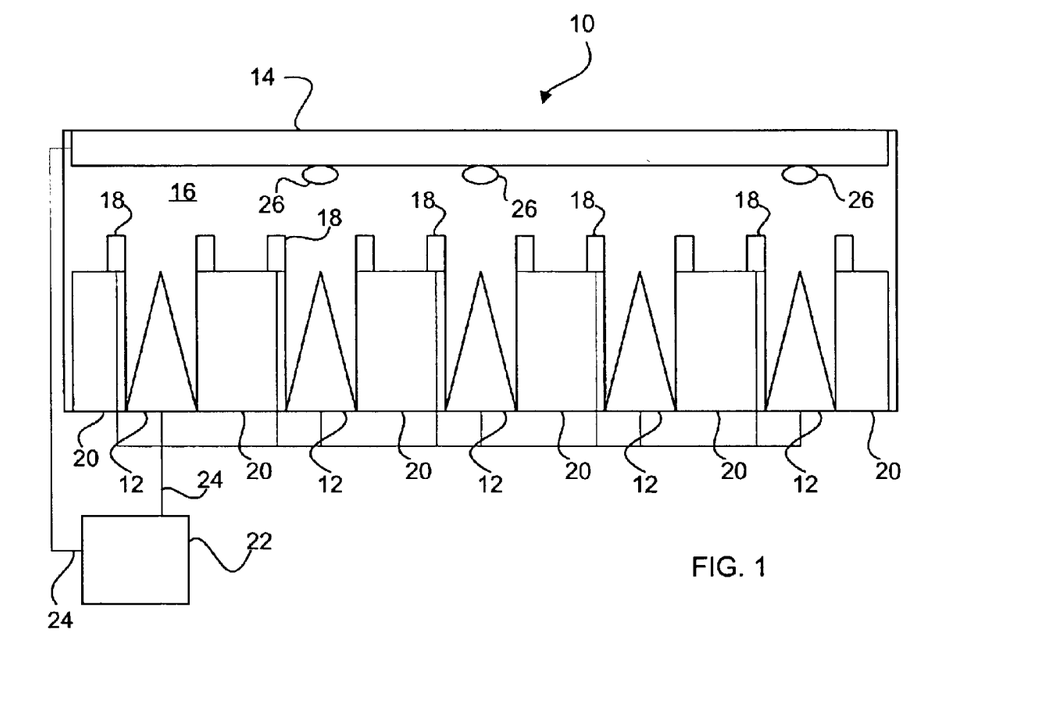
FIG. 1 is a cross section of a portion of a preferred embodiment memory apparatus of the invention.
Figure 2:
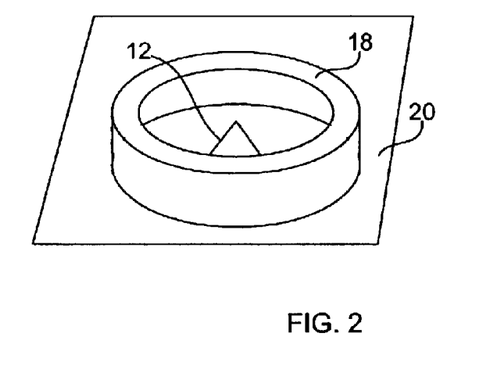
FIG. 2 is a perspective of a portion of the preferred embodiment memory apparatus of FIG. 1.

Turning now to the drawings, FIG. 1 is a cross section of a portion of a preferred memory apparatus of the invention, shown generally at 10. The memory apparatus 10 has a plurality of first electrodes 12 that are spatially arranged with respect to one another and are individually addressable. A second electrode 14 is separated from the first electrodes 12 by a liquid electrolyte solution 16. Walls or other structure may be provided to create a chamber or other enclosure for containing the electrodes 12 and 14 and the electrolyte 16. An individually addressable and generally circular sensor electrode 18 surrounds each of the first electrodes 12, with the sensor electrode 18 supported on a dielectric material 20. The spatial configuration of a sensor electrode 18 and a first electrode 12 is further illustrated in the perspective view of FIG. 2 showing one generally circular sensor electrode 18 surrounding the tip of a first electrode 12. The first electrodes 12, second electrode 14, and sensor electrodes 18 all preferably comprise noble electrodes.

The preferred memory apparatus of FIG. 1 further comprises a controller 22 linked by a control circuit 24 to each of the first electrodes 12, the second electrode 14, and the sensor electrodes 18. Each of the first electrodes 12 and the sensor electrodes 18 are individually addressable by the controller 22. Also, the controller 22 may facilitate electrically linking any one of the first electrodes 12 or the sensor electrodes 18 to the second electrode 14 in order to cause an electrical current to flow through the electrolyte 16 between a selected first electrode 12 or sensor electrode 18 and the second electrode 14. The controller 22 may comprise, for example, a chip or a microprocessor.

In operation, the memory apparatus 10 may be used to store, read, and erase information. In particular, when the controller 22 causes an electric current to flow between one or more selected first electrodes 12 and the second electrode 14, the surface of the second electrode 14 is electrochemically modified. In particular, an electrochemically active material 26 is electrodeposited from the electrolyte on the second electrode 14. By causing the electrochemically active material 26 to be selectively deposited on the second electrode 14, information may be coded in a binary matter. That is, each first electrode 12 and corresponding location on the second electrode 14 may be thought of as a bit, and the presence or absence of an electrochemically active material 26 in that location corresponding to a high or low state for the bit (i.e., a 1 or 0).

The first electrodes 12 preferably have the general shape of a cone so as to more precisely direct the location of deposited solid on the second electrode 14. Also, the dielectric 20 supporting the sensor electrode 18 is provided to help minimize "cross talk" between the individual first electrodes 12. That is, the dielectric 20 helps to minimize influence that one first electrode 12 may have on a neighboring first electrode 12 when writing information. For this reason the preferred dielectric 20 has a height substantially equal or larger than the height of the first electrode 12.

The electrochemically active material 26 preferably comprises a metal deposit. Those knowledgeable in the art will appreciate that the electrolyte solution may contain ions of one or more of many materials capable of being electrodeposited, with metal ions comprising preferred examples. By way of further example, metals such as Zn, Co, Ni, Fe, Cu, Al, Ag, Cr, Mn, V, Ti, Sn, In, Rh, Pd, Cd and/or Mo may be useful for practice of invention embodiments. Because switching speed is proportional to the square of the number of electrons transferred in the reaction, materials such as Ag that require the transfer of only one electron are preferred. The switching speed with a Ag solution is 4 times as fast as that of a solution using, for example, Al, Co, Cu, Fe, Ni, Cr or Zn (all of which require two electrons). Those skilled in the art will likewise appreciate that a desired concentration of ion in the electrolyte solution, the magnitude of the electrical current required to electrodeposit the solid, and other factors concerning the electrodeposition may be calculated using well known electrochemical relationships, such as, for example, Faraday's Law, Fick's Second Law of diffusion, and the Debye-Huckel or Guoy-Chapman model of double layer charging.

By way of a particular exemplary electrolyte, an aqueous solution of Ag+ ions (as silver cyanide, AgCN) with a concentration of between about 0.1 and about 1.5 mol/l, and a temperature in the range of about 20 to about 75° C. is believed to be useful with practice of the invention. The electrolyte may also contain additives such as potassium cyanide (KCN) in the concentration range of about 0.5 to about 2.5 mol/l, potassium carbonate ($K_2CO_3$) in the concentration range of about 0.1 to about 1.0 mol/l, potassium nitrate ($KNO_3$) in the concentration range of about 0.1 to about 1.0 mol/l and potassium hydroxide (KOH) in the concentration range of about 0.05 to about 0.5 mol/l. A number of organic brighteners in ppm concentrations may also be present.

In addition to deposition of a metal, other invention embodiments may comprise deposits of other electrochemically active materials. For example, a magnetic material such as NiFe could be electrodeposited and detected through measurement of magnetic field. Further, some invention embodiments may not deposit a material at all, but instead may store information by causing an electrochemical modification on one of the selected first or second electrodes. For example, by causing a current to flow through the electrolyte, the oxidation state of the surface of one of the electrodes could be modified.

The controller 22 may cause the memory apparatus 10 to read information by causing the sensor electrodes 18 to sense the electrochemical modification to the second electrode 14. In particular, the sensor electrode 18 may measure an electrical property such as resistance between it and the second electrode 14. Presence of the metal deposit 26 will result in a lower resistance between the sensing electrode 18 and the second electrode 14 since the metal deposit 26 has a higher conductivity than the electrolyte 16. The generally circular shape of the sensor electrode 18 is advantageous for focusing of an electric field proximate the location of the deposit 26. Those skilled in the art will appreciate that there are a number of manners in which to sense the presence of the metal deposit 26. For example, a sensor may measure a magnetic field strength to detect the presence of a deposited magnetic material.

Presence of an electrochemically active material such as the metal deposit 26 in a particular region of the second electrode 14 may be interpreted as a change of state in a particular bit. That is, for each portion of the second electrode 14 that corresponds to one of the plurality of first electrodes 12, a binary "high" state may be indicated by the presence of a metal deposit 26, and a binary "low" state indicated by the absence of a metal deposit 26. Other invention embodiments may comprise storing more than one bit of information per metal deposit. That is, an electrochemically active deposit may store more than a 1 or 0 state, and may, for instance, store a 1, 2, 3 or 4 state, a byte, or other amount of information. For example, x, y, and z dimensions of the deposit 26 could be further used to store additional bits of information. Also, different deposit materials in combination could be used to store additional bits of information.

The controller 22 may also cause the memory apparatus 10 to erase information through change of a particular bit from a high to a low state. In particular, the controller 22 may cause an electric current to flow between one or more a selected of the sensing electrodes 18 and the second electrode 14 to cause a selected metal deposit 26 to go back into solution. For example, the controller 22 may cause one or more selected sensing electrodes 18 to function as anodes so as to ionize the metal deposit 26. Other means for erasing information could be provided. For example, erasing information could be accomplished by causing a current to flow between a first electrode 12 and the second electrode 14 (i.e., reverse the polarity of the writing current). It is preferred to use a separate electrode, such as a sensor electrode 18, however, so as to not foul the tip of the first electrode 12.

Figure 3:
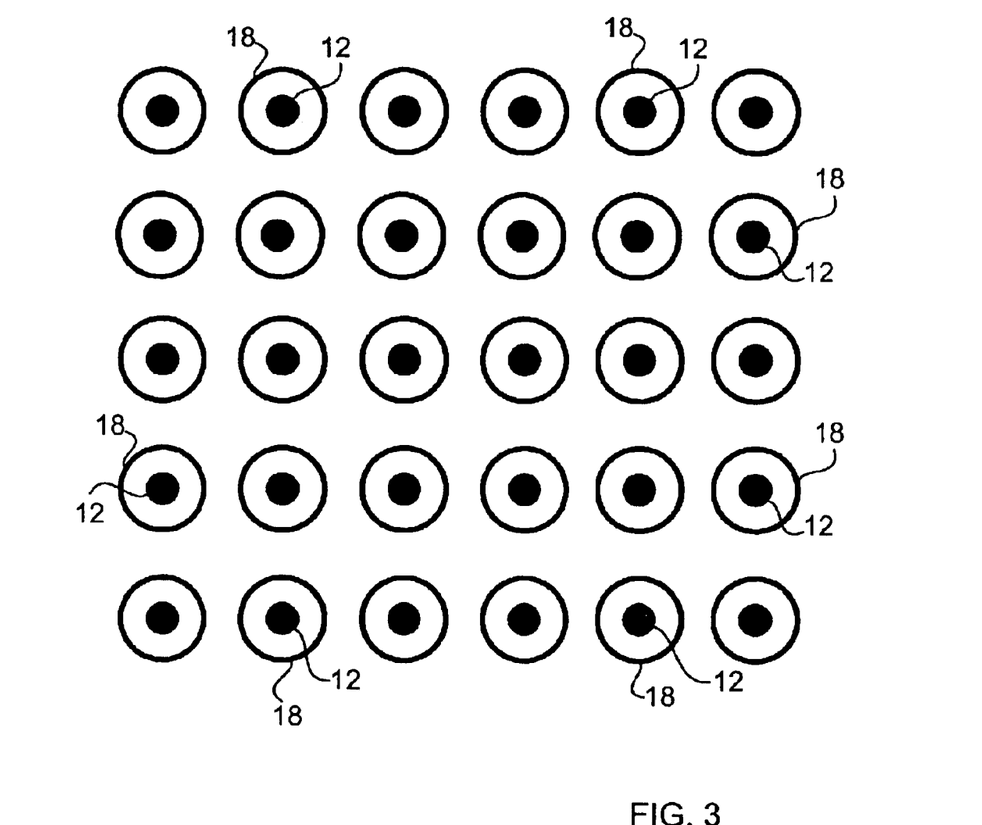
FIG. 3 is a top plan view of a portion of the preferred embodiment memory apparatus of FIG. 1.

It will be appreciated that a spatial arrangement of the plurality of first electrodes 12, sensor electrodes 18, and sections of the second electrode 14 may allow for additional coding of information. For example, the plurality of first electrodes 12 and sensor electrodes 18 may be spatially arranged in a plurality of rows and columns, as generally illustrated in the top plan view of FIG. 3 showing a plurality of first electrodes 12 and sensor electrodes 18. Also, it will be appreciated that the numbers of first electrodes 12 and sensor electrodes 18 shown in FIGS. 1 and 3 are for illustration purposes only, and that in practice it may be desirable to practice the invention using great multiplicities of electrodes to achieve high memory storage capacities.

Additionally, it will be appreciated that the first electrodes 12, second electrode 14, and sensor electrodes 18 may be provided on a micro scale so as to accomplish a desirably high density of memory with a memory apparatus of the invention. By way of example preferred dimensions, generally inverted cone shaped first electrodes 12 having a base width of between about 250 and about 500 nm and a height of approximately the same dimensions could be used. Spacing between the first electrodes 12 and the second electrode 14 is preferably about 1 micron or less. Example preferred dimensions for the generally ring shaped sensor electrode 18 include an inside diameter about the same as or slightly larger than the base width of the first electrode 12, a height of about 100 nm or less, and a width of about 50 to about 100 nm. Using electrodes of this scale, a memory density of the order of about 4 bits per micron may be achieved.

The operational speed of the memory apparatus 10 is believed to generally be limited by ionic diffusion in the electrolyte 16. That is, information can only be written, read and erased as fast as current moves (i.e. transport of ionic species) through the electrolyte 16. Regardless of the magnitude of current applied, the actual current realized (and accordingly the surface reaction rate at the electrode 14) depends on how readily the current is carried between the electrodes 12 and 14. The flow of current through the electrolyte 16, and thus information write/erase speeds, depends on a number of factors including chemical species, size, mobility, charge, concentration, electrolyte temperature, electrode 12 and 14 spacing, minimum deposit thickness, and the like. For example, the thickness of the metal deposit 26 will vary with the time of current flow. It is believed that a deposit thickness of between about 5 nm and about 100 nm will be useful with practice of the preferred apparatus of the invention.

Taking a deposit thickness of about 100 nm and electrode 12 and 14 spacing of about 1 micron by way of example, the record and erase speeds may each be on the order of 10 millisecond for a typical nickel salt electrolyte at 50° C. The controlling variables could be manipulated to improve the speed, with a maximum record speed of the order of about 1 millisecond believed to be achievable. Sensing speeds are generally much faster than those of the write/erase functions. Sensing resistivity for example could be performed at speeds greater than 1 millisecond. Accordingly, it is estimated that a complete write/read/erase cycle for information could likely be achieved using the preferred apparatus of the invention on the order of between about 2 and about 5 milliseconds.

Other exemplary memory apparatus embodiments may have a plurality of individually addressable second electrodes 14. A single second electrode 14 is preferred, however, for ease of control, cost of manufacture, and complexity considerations. Also, it will be appreciated that the memory apparatus 10 of the invention may be useful with the solids 26 deposited on either of the first electrodes 12 or second electrode(s) 14. Indeed, reversing the polarity between the respective electrodes 12 and 14 may reverse the direction of deposition. By way of still additional example, other apparatus embodiments may comprise a sensor that is separate from an erasing electrode.

Figure 4:
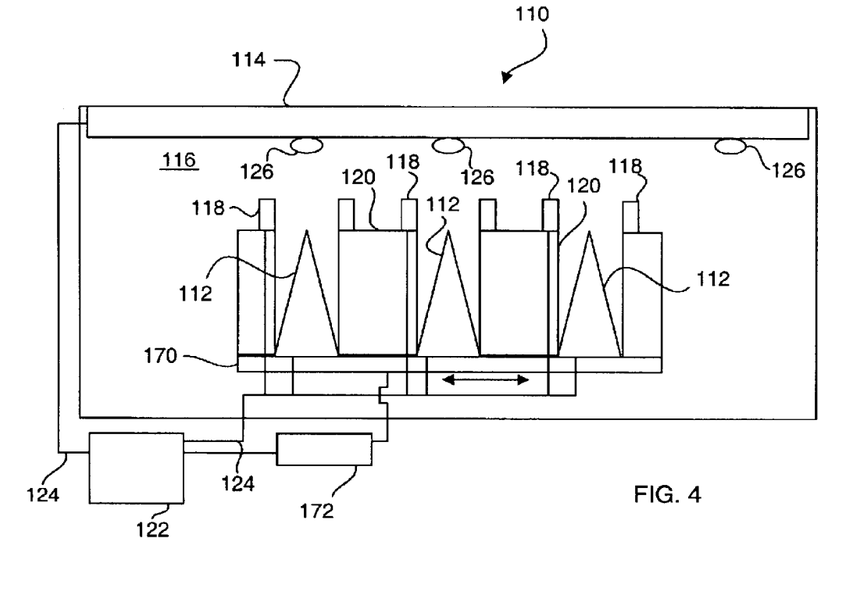
FIG. 4 is a cross section of a second exemplary preferred embodiment memory apparatus of the invention.

FIG. 4 illustrates an additional exemplary preferred memory apparatus 110 of the invention that is useful to further increase information storage density. Generally, the apparatus 110 is consistent in most respects with the apparatus 10. Similar element numbers have been used for elements of the apparatus 110 that are generally consistent with those of the apparatus 10 for convenience. Generally, a plurality of first electrodes 112 is separated from an opposing second electrode 114 by an electrolyte 116. To store information, an electric current flows across the electrolyte to cause an electrochemically active material 126 to deposit on the surface of the second electrode 114. A sensor electrode 118 may be used to detect the presence of the electrochemically active material 126 to thereby read the information, and also to erase the information by causing the electrochemically active material 126 to be ionized back into the electrolyte. A controller 122 and control circuit 124 controls the first electrodes 112 and second electrode 114. In addition to these and other aspects of the memory device apparatus 110 that are generally consistent with those of the apparatus 10, the apparatus 110 further comprises a mover 170 attached to the plurality of first electrodes for selectively moving the electrodes in relation to the second electrode 114. A mover control 172 linked to the mover 170 causes the electrodes 112 to move laterally as indicated by the arrow in predetermined distances.

Those knowledgeable in the art will appreciate that movers 170 are generally known. By way of example, the mover 170 may be a micro-motion motor and carriage mechanism. By way of more particular example, description of a suitable mover may be found in the commonly assigned and pending U.S. patent application with Ser. No. 10/157,254 entitled "A Movable Micro-Electromechanical Device," filed on May 28, 2002.

Also, it will be appreciated that the mover 170 could alternatively or additionally be connected to the second electrode 114. It will still further be appreciated that although FIG. 4 illustrates first electrodes along the X-axis only, they preferably also extend along a Y-axis to form an array of rows and columns, and that movement may likewise occur along the Y-axis. The mover control 172 is preferably connected to the controller 122 and controller circuit 124.

Using the mover 170, any one of the plurality of first electrodes 112 may be used to electrochemically modify different discrete portions of the second electrode 114 surface. Preferably, the mover 170 is capable of accurately moving the electrodes 112 very small distances of the order of 100 nm or less. With movements of this order, the second electrode surface may have discrete modifications separated by about 100 nm or less. It is believed that with the mover 170 the apparatus 110 may accordingly be capable of storing information at a density of up to about 10 bits per micron.

Those skilled in the art will further appreciate that a memory apparatus of the invention may be useful in a number of different applications. In many of these applications, the memory apparatus of the invention may further comprise integrated circuitry. For example, a memory apparatus such as the that shown generally at 10 may be connected to integrated circuitry for use in a handheld electronic device such as a laptop or palmtop computer device, a communications device such as a cellular phone, or the like.

Figure 5:
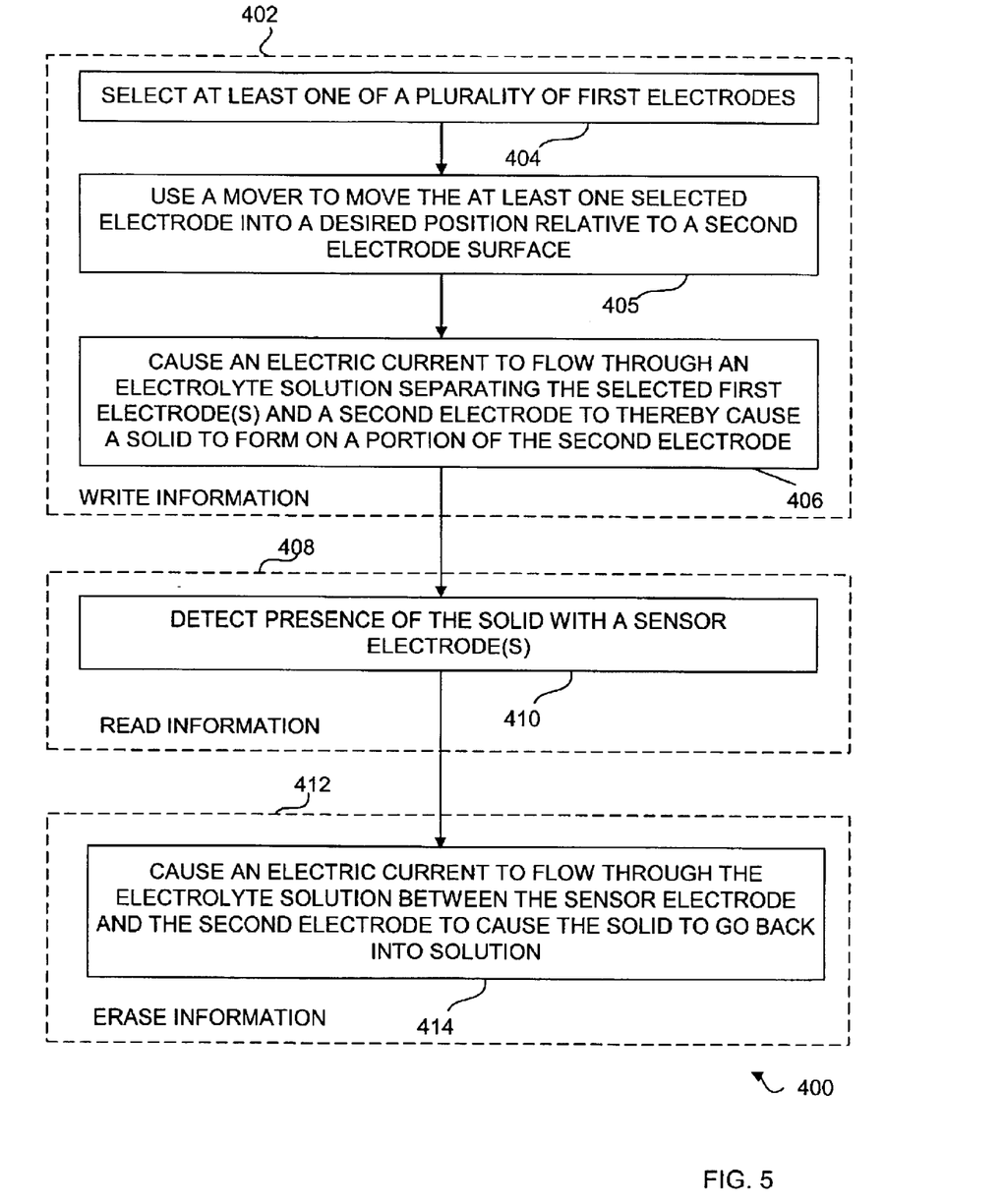
FIG. 5 is a flow chart of a preferred embodiment method of the invention.

Another embodiment of the invention is directed to a method for storing information. In considering methods of the invention, it will be appreciated that a memory apparatus of the invention such as that illustrated by FIGS. 1–3 may be useful in practice of method embodiments of the invention. FIG. 5 is a flowchart illustrating steps of a preferred embodiment method of the invention for writing, reading, and erasing information from a memory apparatus. In the invention method embodiment illustrated generally at 400, the dashed line block 402 includes steps for writing the information. At least one first electrode is selected from a plurality of first electrodes (block 404), and then moved using a mover to a desired position relative to a second electrode (block 405). A current is then caused to flow through an electrolyte solution that separates the selected first electrode from a second electrode to cause a solid to be electrodeposited onto the second electrode (block 406).

The dashed line block 408 includes a step of reading the information. In particular, the presence of the solid is detected using a sensor (block 410). Preferably, a plurality of sensors is provided, with one each corresponding to one each of the first electrodes. The sensor preferably detects the presence of the solid by measuring an electrical property such as resistance or magnetic field. Most preferably, the sensor comprises an electrode that substantially surrounds the first electrode.

The dashed line block 412 includes steps for erasing the information. The solid may be removed from the second electrode by causing a current to flow between that electrode and the sensor electrode to cause the metal to ionize back into solution (block 414).

While a specific embodiment of the present invention has been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A memory apparatus for storing information comprising:
   at least three spatially arranged first electrodes, each of said at least three first electrodes being individually addressable;
   a dielectric separating each of said first electrodes from one another;
   a second electrode proximate to said at least three first electrodes and having a surface with a plurality of spatial positions, said second electrode separated from said first electrodes by a first distance and separated from said dielectric by a second distance, said first distance at least as large as said second distance; and, an electrolyte solution separating said at least three first electrodes from said second electrode, said electrolyte solution responsive to an electric current communicated therethrough between a selected one of said at least three first electrodes and said second electrode to cause an electrochemical modification to a selected one of said plurality of spatial positions on said surface of said second electrode to thereby store the information.

2. A memory apparatus as defined by claim 1, wherein said electrolyte solution is responsive to an electric current communicated therethrough between a selected second of said at least three first electrodes and said second electrode to cause an electrochemical modification to a second selected spatial position on said surface of said second electrode to thereby store the information.

3. A memory apparatus for storing information as defined by claim 1 and further comprising a plurality of sensors for determining which of said plurality of spatial positions on said second electrode surface has been modified, each of said plurality of sensors being located closer to said second electrode than is any of said at least three first electrodes.

4. A memory apparatus as defined by claim 3 wherein each of said sensors is generally ring shaped and surrounds one of said first electrodes.

5. A memory apparatus as defined by claim 4 wherein each of said ring shaped sensors is supported on said dielectric.

6. An integrated circuit comprising a memory apparatus for storing, reading and erasing information, comprising:
a plurality of individually addressable first electrodes each having a height, said plurality of individually addressable first electrodes separated from one another by a dielectric with a height substantially equal or greater to said first electrode height;
a plurality of individually addressable sensor electrodes, one each of said plurality of sensor electrodes proximate one each of said plurality of first electrodes;
a second electrode separated by a gap from said plurality of first electrodes and said plurality of sensor electrodes;
a mover connected to said plurality of first electrodes for selectively moving said plurality of first electrodes relative to said second electrode;
an electrolyte solution filling said gap; and,
a control circuit connected to said plurality of first electrodes, said plurality of sensor electrodes, and said second electrode, said control circuit for storing information by causing an electrical current to flow between at least one selected of said plurality of first electrodes and said second electrode to cause an electrochemically active material to deposit on said second electrode, said control circuit for reading information by causing a selected of said plurality of sensors to detect said electrochemically active material on said second electrode through measurement of an electrical property, and said control circuit for erasing information by causing current to flow between said selected sensor and said second electrode to remove said electrochemically active material solid from said surface.

7. A method for recording and reading information comprising the steps of:
selecting one of at least three first electrodes, each of said at least three first electrodes being separated from one another by a dielectric;

causing an electrical current to flow a first distance through an electrolyte solution separating said at least three first electrodes from a second electrode proximate to said at least three first electrodes to cause an electrochemical modification to one selected spatial position from a plurality of spatial positions on said second electrode to thereby store the information, said dielectric separated from said second electrode by a second distance that is no greater than said first distance; and,
reading said information by determining which of said plurality of spatial positions on said second electrode has been modified with a sensor.

8. A method for recording and reading information as defined by claim 7 wherein the step of reading said information by determining which of said plurality of spatial positions on said second electrode has been modified comprises measuring magnetic field with said sensor.

9. A method for recording and reading information as defined by claim 7 wherein the step of moving said selected first electrode comprises moving said first electrode a distance of about 100 nm.

10. A method for recording and reading information as defined by claim 7 wherein said electrochemical modification comprises an electrodeposited electrochemically active material having a thickness of between about 5 nm and about 100 nm.

11. A memory apparatus for storing information comprising:
a plurality of spatially arranged first electrodes, each of said plurality of first electrodes being individually addressable;
at least one second electrode;
an electrolyte solution separating said plurality of first electrodes from said at least one second electrode, said electrolyte solution responsive to an electric current communicated therethrough between a selected one of said plurality of first electrodes and said at least one second electrode to cause an electrochemical modification to the surface of one of said second or said selected first electrodes to thereby store the information; and
at least one sensor supported on a dielectric for detecting said electrochemical modification of said surface, said sensor being closer to said second electrode than are any of said plurality of spatially arranged first electrodes.

12. A memory apparatus as defined by claim 11 wherein each of said plurality of first electrodes has a height, wherein said dielectric separates adjacent of said plurality of first electrodes and has a height at least as great as said first electrode heights.

13. A memory apparatus for storing information comprising:
a plurality of spatially arranged first electrodes, each of said plurality of first electrodes being individually addressable;
at least one second electrode;
an electrolyte solution separating said plurality of first electrodes from said at least one second electrode, said electrolyte solution responsive to an electric current communicated therethrough between a selected one of said plurality of first electrodes and said at least one second electrode to cause an electrochemical modification to the surface of one of said second or said selected first electrodes to thereby store the information, said electrochemical modification comprising an electrodeposited electrochemically active magnetic material; and a plurality of sensors for detecting said electrochemical modification of said surface by measuring a magnetic field, each of said plurality of sensors being generally ring shaped and surrounding one of said plurality of first electrodes.

14. A memory apparatus for storing information comprising:

a plurality of spatially arranged first electrodes, each of said plurality of first electrodes being individually addressable;

a dielectric separating each of said first electrodes from one another;

at least one second electrode separated from said plurality of first electrodes by a first distance and separated from said dielectric by a second distance that is smaller than said first distance;

an electrolyte solution separating said plurality of first electrodes from said at least one second electrode, said electrolyte solution responsive to an electric current communicated therethrough between a selected one of said plurality of first electrodes and said at least one second electrode to cause an electrochemical modification to the surface of one of said second or said selected first electrodes to thereby store the information; and a plurality of sensors for detecting said electrochemical modification of said surface in a time period of less than about 1 millisecond, each of said sensors being supported on said dielectric.

15. A memory apparatus for storing information comprising:

a plurality of spatially arranged first electrodes, each of said plurality of first electrodes being individually addressable;

a dielectric disposed between adjacent of said first electrodes for preventing cross-talk between said adjacent first electrodes;

at least one second electrode separated from said plurality of first electrodes by a first distance that is greater than a second distance between said second electrode and said dielectric wherein said dielectric reduces cross talk between said plurality of first electrodes; and, an electrolyte solution separating said plurality of first electrodes from said at least one second electrode, said electrolyte solution responsive to an electric current communicated therethrough between a selected one of said plurality of first electrodes and said at least one second electrode to cause an electrochemical modification to the surface of one of said second or said selected first electrodes to thereby store the information, said electrochemical modification comprising deposit of an electrochemically active material having a thickness of between about 5 nm and about 100 nm.

16. A memory apparatus for storing information comprising:

a plurality of spatially arranged first electrodes, each of said plurality of first electrodes being individually addressable and having a height;

a dielectric between each of said plurality of first electrodes, said dielectric having a height at least as large as said first electrode height;

at least one second electrode; and an electrolyte solution separating said plurality of first electrodes from said at least one second electrode, said electrolyte solution responsive to an electric current communicated therethrough between a selected one of said plurality of first electrodes and said at least one second electrode to cause an electrochemical modification to the surface of one of said second or said selected first electrodes to thereby store the information, said plurality of first electrodes extending into said electrolyte solution in a direction toward said second electrode by a first distance that is no more than a second distance that said dielectric extends into said electrolyte solution in said direction.

17. A memory apparatus for storing information comprising:

a plurality of spatially arranged first electrodes, each of said plurality of first electrodes being individually addressable;

a dielectric between adjacent of said plurality of first electrodes and having a height at least as great as said first electrodes, said dielectric for preventing cross-talk between adjacent of said plurality of first electrodes;

at least one second electrode separated from said plurality of first electrodes by a first distance that is not smaller than a second distance that separates said dielectric from said second electrode;

an electrolyte solution separating said plurality of first electrodes from said at least one second electrode, said electrolyte solution responsive to an electric current communicated therethrough between a selected one of said plurality of first electrodes and said at least one second electrode to cause an electrochemical modification to the surface of one of said second or said selected first electrodes to thereby store the information; and wherein said plurality of first electrodes and said at least one second electrode are separated by a distance of about 1 micron or less.

18. A memory apparatus for storing information comprising:

a plurality of spatially arranged first electrodes, each of said plurality of first electrodes being individually addressable;

a dielectric separating each of said first electrodes from one another;

at least one second electrode separated from said plurality of first electrodes by a first distance that is greater than a second distance that separates said second electrode from said dielectric wherein said dielectric is effective to minimize cross talk between said plurality of first electrodes; and, an electrolyte solution separating said plurality of first electrodes from said at least one second electrode, said electrolyte solution responsive to an electric current communicated therethrough between a selected one of said plurality of first electrodes and said at least one second electrode to cause an electrochemical modification to the surface of one of said second or said selected first electrodes to thereby store the information; and a mover connected to one of said second electrode or to said plurality of first electrodes for selectively moving said one of said second electrode or said plurality of first electrodes relative to the other.

19. A memory apparatus for storing information as defined by claim 18 wherein said mover is connected to said plurality of first electrodes for selectively moving said first electrodes relative to said second electrode, further comprising a controller connected to said mover for controlling said movement, and wherein said mover may selectively move said first electrodes distances of about 100 nm.

20. A memory apparatus for storing information comprising:
- a plurality of spatially arranged first electrodes, each of said plurality of first electrodes being individually addressable;
- a dielectric separating each of said first electrodes from one another;
- at least one second electrode;
- an electrolyte solution separating said plurality of first electrodes from said at least one second electrode, said electrolyte solution responsive to an electric current communicated therethrough between a selected one of said plurality of first electrodes and said at least one second electrode to cause an electrochemical modification to the surface of one of said second or said selected first electrodes to thereby store the information, said plurality of first electrodes extending into said electrolyte solution towards said second electrode by a first distance that is less than a second distance that said dielectric extends into said electrolyte solution whereby said dielectric minimizes cross talk between said plurality of first electrodes; and
- wherein said plurality of first electrodes and said second electrode being spatially arranged to store information at a density of at least about 4 bits per micron.

21. A memory apparatus for storing information as defined by claim 20 wherein said density is at least about 10 bits per micron.

22. A memory apparatus for storing information comprising:
- a plurality of spatially arranged and individually addressable first electrodes;
- a dielectric between adjacent of said plurality of first electrodes;
- at least one second electrode; and,
- an electrolyte solution separating said plurality of first electrodes from said at least one second electrode by a first distance and separating said second electrode from said dielectric by a second distance that is less than or equal to said first distance, said electrolyte solution responsive to an electric current communicated therethrough between a selected one of said plurality of first electrodes and said at least one second electrode to cause an electrochemical modification to the surface of one of said second or said selected first electrodes in a time period of about 1 millisecond to thereby store the information.

23. A memory apparatus for writing, reading, and erasing information comprising:
- an electrode surface;
- a plurality of individually addressable and spatially arranged first means opposing said electrode surface for electrodepositing an electrochemically active material on said electrode surface in discrete locations;
- means for detecting said electrochemical modification at said discrete locations;
- means for reversing said electrochemical modification at said discrete electrode surface locations; and
- wherein said means for detecting said electrochemically modified surface and said means for reversing said electrochemical modification are integral with one another and comprise a plurality of spatially arranged second means opposing said electrode surface, each of said means for detecting and means for reversing having a general ring shape and surrounding one each of said first means.

24. A memory apparatus for storing information comprising:
- at least three spatially arranged first electrodes, each of said at least three first electrodes being individually addressable;
- a second electrode proximate to said at least three first electrodes and having a surface with a plurality of spatial positions;
- an electrolyte solution separating said at least three first electrodes from said second electrode, said electrolyte solution responsive to an electric current communicated therethrough between a selected one of said at least three first electrodes and said second electrode to cause an electrochemical modification to a selected one of said plurality of spatial positions on said surface of said second electrode to thereby store the information; and,
- a plurality of sensors connected to a control circuit, one each of said plurality of sensors proximate one each of said at least three first electrode, each of said sensors for detecting said electrochemical modification of said selected one spatial position on said second electrode surface.

25. A memory apparatus for storing information as defined by claim 24 wherein each of said plurality of sensors comprises a third electrode substantially surrounding one each of said at least three first electrodes.

26. A memory apparatus for storing information as defined by claim 24 wherein each of said plurality of sensors comprises a generally ring shaped electrode surrounding one of said at least three first electrodes, said ring shaped sensor electrode having an inside diameter of about 250 nm to about 500 nm, a width of about 50 nm to about 100 nm, and a height of about 100 nm or less.

27. A memory apparatus for storing information as defined by claim 24 wherein each of said plurality of sensors is further for erasing the information by reversing said electrochemical modification of said selected one spatial position on said second electrode surface.

28. A memory apparatus for storing information comprising:
- a plurality of spatially arranged first electrodes, each of said plurality of first electrodes being individually addressable and having a general cone shape with a base width of between about 250 nm and about 500 nm, and a height between about 250 nm and about 500 nm;
- at least one second electrode; and,
- an electrolyte solution separating said plurality of first electrodes from said at least one second electrode, said electrolyte solution responsive to an electric current communicated therethrough between a selected one of said plurality of first electrodes and said at least one second electrode to cause an electrochemical modification to the surface of one of said second or said selected first electrodes to thereby store the information.

* * * * *